United States Patent [19]
Sturdivant

[11] Patent Number: 5,886,587
[45] Date of Patent: Mar. 23, 1999

[54] FLIPPED LUMPED ELEMENT CIRCULATOR

[75] Inventor: Rick L. Sturdivant, Placentia, Calif.

[73] Assignee: Raytheon Company, Lexington, Mass.

[21] Appl. No.: 798,257

[22] Filed: Feb. 11, 1997

[51] Int. Cl.⁶ .................................................. H01P 1/383
[52] U.S. Cl. .............................. 333/1.1; 29/830; 29/846
[58] Field of Search ................................. 333/1.1, 24.1; 29/602.1, 830, 846

[56] References Cited

U.S. PATENT DOCUMENTS

| | | | |
|---|---|---|---|
| 4,259,684 | 3/1981 | Dean et al. | 333/1.1 X |
| 5,017,894 | 5/1991 | Naito | 333/1.1 |
| 5,223,805 | 6/1993 | Talcott et al. | 333/1.1 |

*Primary Examiner*—Paul Gensler
*Attorney, Agent, or Firm*—Leonard A. Alkov; Glenn H. Lenzen, Jr.

[57] ABSTRACT

A lumped element circulator is provided in addition to a method for producing and flip mounting the circulator to a substrate. The resonant elements of the circulator are connected in either a delta or Y configuration which produces a three port electrical circuit. The fabrication technique associated with this invention allows the lumped element circulator to be manufactured in either a crossover or non-crossover style circulator. The circulator includes a ferrite layer having three inductors formed on its top surface to create either the delta or Y resonant element configuration. Contact bumps are attached at the terminal locations of the inductors. A magnet is secured to the bottom of the ferrite layer, forming a ferrite wafer. Optionally, a dielectric layer is disposed between the ferrite and the magnet. A plurality of capacitors and mounting pads are formed on a separate substrate by printing metal strips thereon. Once the ferrite wafer and substrate components are fabricated, the ferrite wafer is flipped over and the contact bumps are secured to the mounting pads.

11 Claims, 3 Drawing Sheets

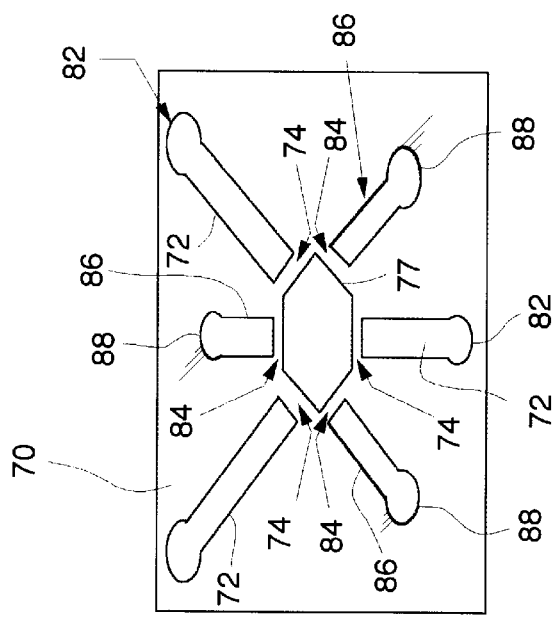
FIG. 9
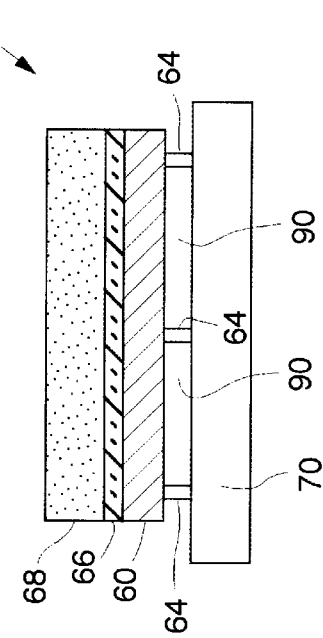
FIG. 11
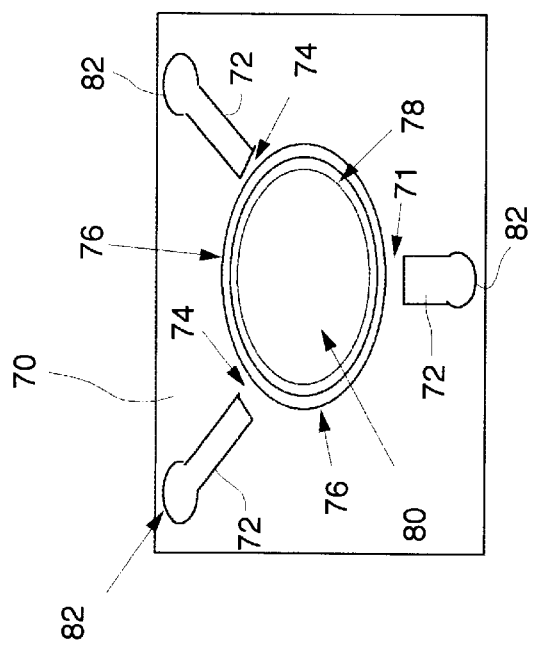
FIG. 8
FIG. 10

FLIPPED LUMPED ELEMENT CIRCULATOR

BACKGROUND OF THE INVENTION

TECHNICAL FIELD

This invention generally relates to an electrical isolation device. More particularly, the present invention relates to a lumped element circulator and a method for fabricating and flip mounting a lumped element circulator.

DISCUSSION

The use of circulators to isolate electrical signals is generally known within the electronics art. Circulators are currently used in both commercial and military applications where electronic circuits or systems require very high frequency signals to transmit information. Exemplary applications include the use of circulators in microwave integrated circuits and microwave transmit and receive modules. Circulators have potential for widespread use in consumer electronics applications such as cellular radio or cellular telephone communication systems. However, the costs associated with using conventional circulators have to date generally made such applications prohibitive.

Circulators can generally be classified into distributed circulators and lumped element circulators. The distributed circulators known within the art are typically realized by using either patched type resonators or transmission line type resonators. The problems associated with conventional distributed circulators include high manufacturing costs and limitations with current fabrication techniques which do not allow the individual circuit components to be integrated into a single package.

In an attempt to overcome the problems associated with conventional distributed circulators, development within the art has produced lumped element circulators. These lumped element circulators are fabricated with discrete or nearly discrete lumped circuit elements such as inductors and capacitors. While these first generation lumped element circulators are approximately one tenth the size of conventional distributed circulators, they still require significant fabrication costs in order to produce a circulator contained within a single downsized package. This limitation has prevented lumped element circulators from achieving widespread use in mass produced electronics applications.

In view of the limitations associated with prior art circulators, it would be desirable to provide a circulator which allows circuits and components to be electrically isolated from one another, and which can take advantage of low cost fabrication techniques. In addition, it would be desirable to provide a lumped element circulator which is approximately one thirtieth the size of current lumped element circulators, which would allow for higher levels of integration in the manufacturing process. Furthermore, it is desirable to provide a lumped element circulator using low cost materials thereby producing a small wafer which can be flip mounted to a substrate or system board.

It is another object of the present invention to provide a fabrication technique in which flip mounted lumped element circulators can be produced at a significantly lower cost. Such a technique would allow reduced size circulators to be employed in consumer electronic and communication systems such as cellular phones and cellular modems, and further assist in lowering the cost of producing these devices.

SUMMARY OF THE INVENTION

Pursuant to the present invention, a low cost lumped element circulator having a significantly reduced packaging size is provided. The comparative simplicity of the lumped element circulator embodied in the present invention allows the device to be manufactured into a very small component. In addition, a technique is disclosed for flip mounting this new lumped element circulator to a supporting substrate or a larger circuit board. The result is numerous improvements over conventional distributed circulators and conventional lumped element circulators, as well as methods for manufacturing these conventional devices.

In accordance with the teachings of one embodiment of this invention, a flip mounted lumped element circulator is employed. The resonant elements, typically inductors, are connected in either a delta or Y configuration which produces a three port electrical circuit. The fabrication technique associated with this invention allows the lumped element circulator to be manufactured in either a crossover or non-crossover style circulator. Preferably, the circulator includes a ferrite layer having a plurality of metal strips deposited thereon to create either the delta or Y resonant element configuration. The metal strips form the inductors of the circulator. Contact bumps are attached at the terminal locations of the metal strips. A magnet is secured to the bottom of the ferrite surface, or the surface opposite that containing the inductors. In an alternate embodiment, a dielectric layer is disposed between the ferrite and the magnet. This configuration forms a ferrite wafer assembly. A plurality of capacitors are formed on a separate substrate by printing metal strips thereon, and leaving non-conductive spaces which create the dielectric regions for each of the capacitors. A plurality of mounting pads are formed at the terminal end of each capacitor. Once the separate ferrite wafer and substrate components are completely fabricated, the ferrite wafer is flipped over and positioned such that each contact bump is aligned with and contacts each mounting pad. The wafer and substrate are then secured together by various means including solder, conductive adhesive or conductive epoxy.

Also in accordance with the teachings of this invention, a method is provided for fabricating a significantly smaller lumped element circulator and flip mounting the circulator to a substrate. In a preferred embodiment, a large ferrite layer is printed with up to several hundred metal strips which comprise the individual inductors for each wafer assembly. The magnetic layer, and optionally the dielectric layer, are then secured to the ferrite layer. The metal contact bumps are then attached to the terminal ends of the metal inductor strips. Once the fabrication of the monolithic ferrite wafer is complete, the entire structure can then be diced into individual wafers using a diamond tipped cutting blade or other suitable device. The individual wafers are then flip mounted and secured to the mounting substrate to complete the structure of the lumped element circulator.

BRIEF DESCRIPTION OF THE DRAWINGS

Additional objects, advantages and features of the present invention will become apparent from the following description and appended claims, taken in conjunction with the accompanying drawings in which:

FIG. 8 is a top view of the substrate with the lumped capacitor elements, mounting pads, and grounding elements printed thereon in accordance with a preferred embodiment of the present invention;

FIG. 9 is a top view of the substrate with the lumped capacitor and inductor elements printed thereon in accordance with an alternative preferred embodiment of the present invention;

FIG. 10 is a side view of the ferrite and magnet layered wafer flip mounted to the substrate in accordance with a preferred embodiment of the present invention; and FIG. 11 is a side view of the ferrite, dielectric, and magnet layered wafer flip mounted to the mounting substrate in accordance with an alternative preferred embodiment of the present invention.

DETAILED DESCRIPTION OF THE PREFERRED EMBODIMENTS

Figure 1A:
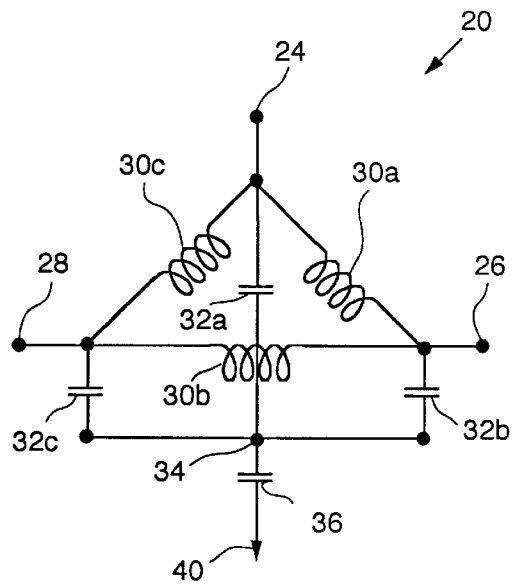
FIGS. 1A through 1D are schematic diagrams of exemplary electrical circuits modeling the lumped element circulator of the present invention in both a delta configuration and a Y configuration.

The following description of the preferred embodiments is merely exemplary in nature and is in no way intended to limit the invention, its applications or uses. Additionally, where appropriate in the detailed description like elements are identified with like reference numerals.

The present invention is particularly concerned with a device for electrically isolating various high frequency signal processing components within an electronic circuit system. The primary application of a lumped element circulator is to provide a non-reciprocal signal path which allows various electrical circuits and components to be electrically isolated from each other. Due to their larger size and increased manufacturing cost, conventional lumped element circulators are generally difficult and expensive to fabricate and integrate into a compact electrical system. The invention disclosed herein reduces the circulator fabrication costs while providing an electrical device which can be integrated into a significantly smaller area or packaging unit. A unique feature of this invention is that the lumped element circulator can be flip mounted to its mounting substrate. This feature assists in further reducing the manufacturing costs. Another unique feature disclosed is that the lumped element inductors are fabricated on the top surface of a ferrite layer which form the resonant elements, and the lumped element capacitors are printed on the mounting substrate. This technique serves to simplify the fabrication process while also reducing the size of the resulting device. The invention also employs a bumping process, similar to that used in silicon and gallium arsenide flip chips, which enhances the assembly technique of the device.

Figure 1B:
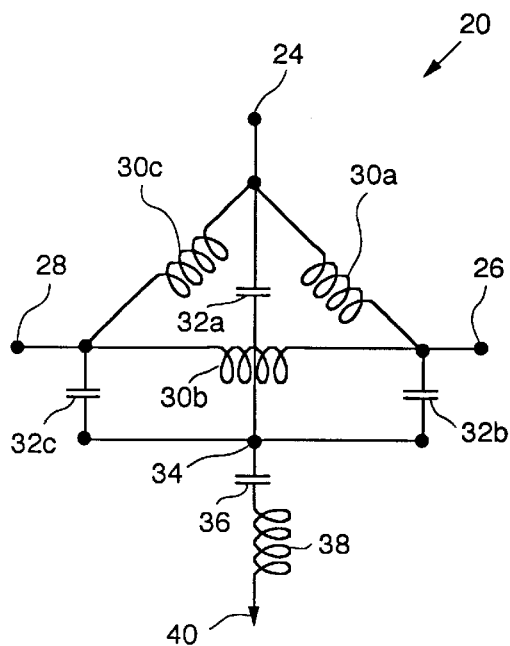

Referring now to FIGS. 1A through 1D, the various circuit schematic diagrams representing the lumped element circulator are disclosed. FIGS. 1A and 1B illustrate circulator 20 wired in a delta configuration. According to this embodiment, circulator 20 is a three port device defined by port one 24, port two 26 and port three 28. These three ports are formed by the end-to-end connection of three inductors 30a, 30b, 30c in the delta configuration. Three capacitors 32a, 32b, 32c are wired into this circuit model by interconnecting one end of each capacitor 32a, 32b, 32c to form a common node 34. The opposite end of each capacitor 32a, 32b, 32c is connected to each corresponding port 24, 26, 28 respectively. A common node capacitor 36 is connected at one end to the common node 34. The opposing end of common node capacitor 36 is connected to ground node 40. With specific reference to the embodiment illustrated by FIG. 1B, a common node inductor 38 can be connected between common node capacitor 36 and ground node 40. The addition of the common node inductor 38 as an additional resonant element serves to increase the bandwidth capabilities of the lumped element circulator 20. Additional details associated with using a common node inductor are disclosed in U.S. Pat. No. 5,223,805 commonly owned by the assignee of the present invention, the disclosure of which is expressly incorporated herein by reference.

Figure 1C:
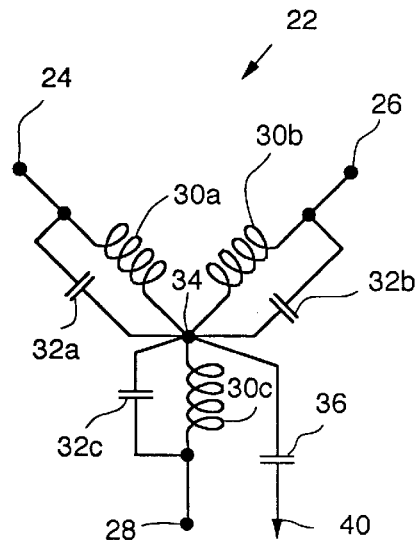
Figure 1D:
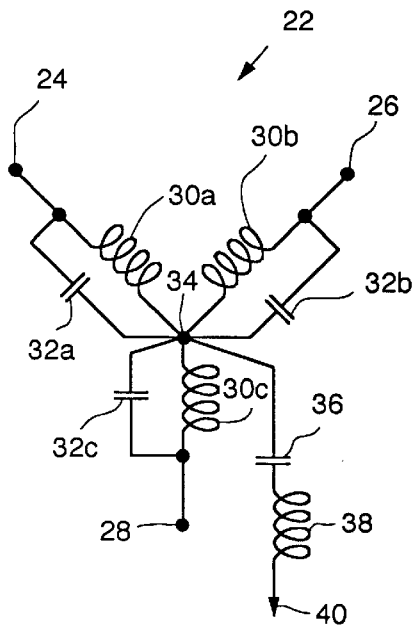

FIGS. 1C and 1D depict the schematic diagram of circulator 22 in a Y configuration. Lumped element circulator 22 is also disclosed as a three port device. In this embodiment, three inductors 30a, 30b, 30c having nearly equal inductance values are connected in a Y configuration with one end of each inductor 30a, 30b, 30c connected to the common node 34, and the opposite end of each inductor 30a, 30b, 30c connected to its associated port 24, 26, 28 respectively. As disclosed above, capacitors 32a, 32b, 32c are interconnected in a Y configuration with one end of each capacitor 32a, 32b, 32c connected to common node 34, and the opposite end of each capacitor 32a, 32b, 32c connected to its associated port 24, 26, 28. The capacitance values of capacitors 32a, 32b, 32c are chosen to tune the inductors 30a, 30b, 30c to form a resonance. As will be appreciated, in both the delta and Y configuration for the inductors 30a, 30b, 30c, the capacitors 32a, 32b, 32c are always connected in a Y configuration. Additionally, the Y configuration of lumped element circulator 22, discloses inductors 30a, 30b, 30c and capacitors 32a, 32b, 32c associated with each port 24, 26, 28 connected in parallel with one another. The Y configuration of lumped element circulator 22 also employs a common node capacitor 36 connected between the common node 34 and the ground node 40. As with the delta configuration, FIG. 1D illustrates an embodiment of the Y configuration lumped element circulator 22 with a common node inductor 38 connected between the common node capacitor 36 and the ground node 40. Accordingly, the addition of the common node inductor 38 serves to increase the bandwidth capabilities of lumped element circulator 22.

Figure 2:
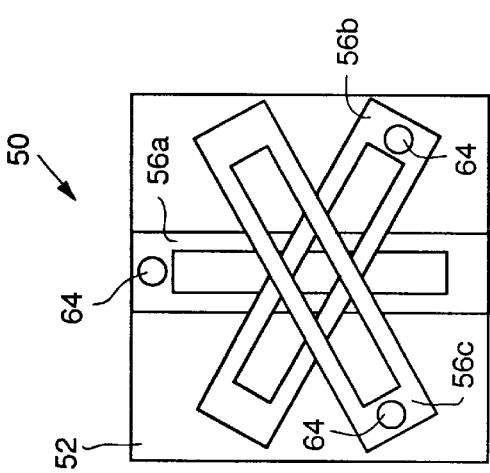
FIG. 2 is a top view of a crossover type lumped element circulator in accordance with a preferred embodiment of the present invention.
Figure 3:
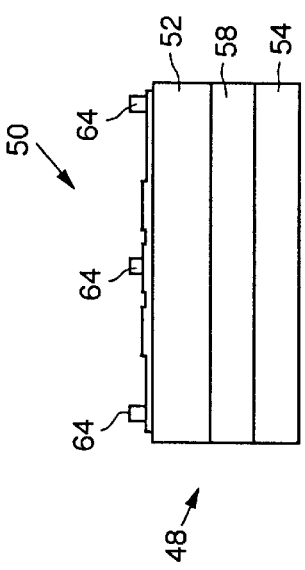
FIG. 3 is a side view of a crossover type lumped element circulator in accordance with a preferred embodiment of the present invention.

Referring now to FIGS. 2 and 3, a crossover type lumped element circulator 50 is disclosed. In this embodiment, crossover type lumped element circulator 50 is produced by printing three individual metal strips 56a, 56b, 56c on the top surface of ferrite layer 52. In fabricating a crossover type circulator 50, a first metal strip 56a is fabricated on the top surface of the ferrite 52. Next, a first dielectric layer (not shown) is formed upon a top central portion of the metal strip 56a. A second metal strip 56b is then printed across the first dielectric layer, and is offset from first metal strip 56a by approximately 60°. Next, a second dielectric layer (not shown) is applied on top of second metal strip 56b. Finally, a third metal strip 56c is printed across second dielectric layer; also at an approximate 60° offset. The resulting structure is three printed metal layers 56a, 56b, 56c separated by two dielectric layers. This structure also can be viewed as six metal strips which radiate from the center of ferrite layer 52.

As viewed in FIG. 3, a dielectric layer 58 is applied to the bottom surface of ferrite layer 52. Wafer assembly 48 is completed by securing a magnetic layer 54 to the bottom surface of dielectric layer 58. The resulting wafer assembly 48 can be fabricated such that dielectric layer 58 is an air space layer, or a solid material such as plastic, ceramic or quartz. In an alternate embodiment (not shown), dielectric layer 58 is left out of wafer assembly 48, and the magnetic layer 54 is soldered or welded directly to the ferrite layer 52. One skilled in the art will appreciate that the metallic crossovers 56a, 56b, 56c cause the surface of ferrite layer 52 to be uneven. To complete the fabrication process, three metal contact bumps 64 are attached to one end of each metal strip 56a, 56b, 56c, and the wafer assembly 48 is flip mounted onto a mounting substrate 70 as shown in FIGS. 10 and 11. Additional details of an exemplary crossover type lumped element circular which is suitable for flip mounting according to the preferred embodiment of the present invention is disclosed in U.S. Pat. No. 5,223,805 incorporated by reference above.

Figure 4:
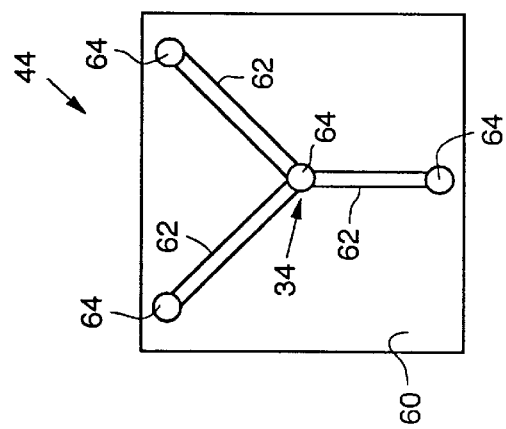
FIG. 4 is a top view of the ferrite layer according to a preferred embodiment of the present invention.

Referring now to FIGS. 4 through 7, the structure and fabrication technique for Y configuration 44 and delta configuration 46 non-crossover type lumped element circulators will be described with particular detail. More specifically, FIG. 4 shows the top surface of the ferrite layer 60 having metal strips 62 and metal contact bumps 64 formed thereon which form the inductive elements of Y configuration lumped element circulator 44. Each of the three metal strips 62 form one of the inductors which are interconnected in a Y configuration. In this configuration, four metal contact bumps 64 are soldered to the metal strips 62, one centrally located at the intersection of the metal strips 62 which forms common node 34, and three disposed at the terminal ends of each metal strip 62. As disclosed, a variety of materials can be used to create metal contact bumps 64. Such materials include gold or silver contact bumps, or preferably, 0.5 mm copper or brass spheres. These metallic spheres are similar to those used with fine line ballpoint pens.

Figure 5:
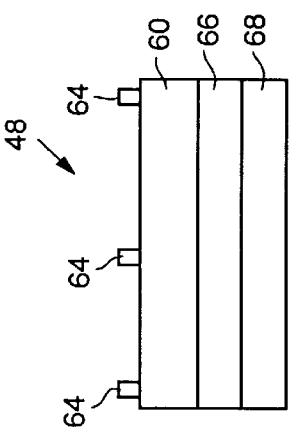
FIG. 5 is a side view illustrating the various layers of the ferrite wafer shown in FIG. 3 in accordance with a preferred embodiment of the present invention.

The completed wafer assembly 48 is depicted in FIG. 5. Wafer assembly 48 is optionally provided with a dielectric layer 66 attached to the bottom surface of ferrite layer 60, and provided with a magnet layer 68 attached to the bottom surface of dielectric layer 66. Magnet layer 68 provides a DC biasing magnetic field, and when combined with the properties of the ferrite layer 60 and metal strips 62 printed thereon, form the resonant inductor elements of the Y configuration lumped element circulator 44.

Figure 6:
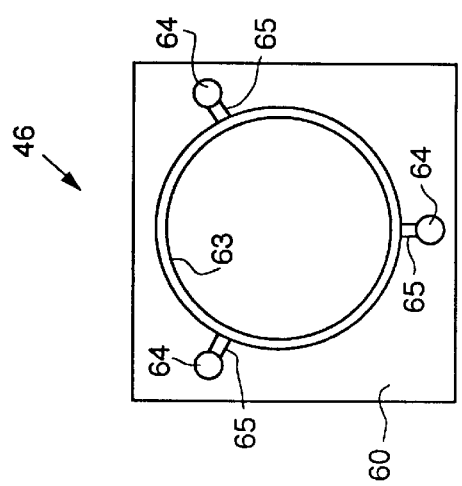
FIG. 6 is a top view of the ferrite layer according to a preferred embodiment of the present invention.
Figure 7:
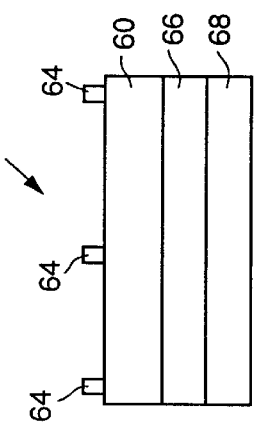
FIG. 7 is a side view illustrating the various layers of the ferrite wafer shown in FIG. 5 in accordance with a preferred embodiment of the present invention.

FIG. 6 also depicts the top surface of a ferrite layer 60 with metal strips 63, 65 printed thereon which form the inductive elements of the delta configuration lumped element circulator 46. In this embodiment, metal strip 63 forms a continuous circle with three short strips 65 radiating therefrom. This layout of metal strips 63, 65 form the delta configuration for lumped element circulator 46. In the delta configuration 46, only three metal contact bumps 64 are used, and are attached to each of the three metal strips 65 radiating from the main circular strip 63. As described above and illustrated in FIG. 7, a dielectric layer 66 and magnetic layer 68 are attached, typically in that order, to the bottom surface of ferrite layer 60, which completely forms wafer assembly 48. Once the wafer assembly 48 is complete, with either the Y configuration 44 or delta configuration 46 inductive elements, the wafer assembly 48 is flipped over so that the metal contact bumps 64 face down, and the metal contact bumps 64 are soldered to a supporting substrate. This technique for mounting wafer assembly 48 is referred to as "flip mounting". The substrate associated with the preferred embodiment of the present invention will be described in more detail below. Additionally, one skilled in the art will readily appreciate that the scope of the present invention includes various flip mounted lumped element circulators fabricated in both crossover and non-crossover style circulators having inductive elements connected in either a delta or Y configuration.

Referring now to FIGS. 8 and 9 the substrate 70 and the discrete capacitive elements formed thereon in a Y configuration are disclosed. A suitable material for substrate 70 is alumina ($Al_2O_3$), however, one skilled in the art will appreciate that other suitable materials or composites may be used for the substrate 70. Each of the three capacitors, such as capacitors 32a, 32b, 32c of FIG. 1A, required by the circulator circuit are formed by printing three individual metal strips 72 on the surface of substrate 70. Using current photolithographic circuit fabrication techniques, three dielectric spaces 74 can be masked off such that no metal is deposited in these locations. To complete the three capacitive elements, a second circular metal strip 76 is printed on the surface of substrate 70, and forms the metal contact opposing metal strips 72. Thus, the three dielectric spaces 74 are disposed between metal strips 72 and circular metal strip 76 which form the three capacitive elements. A second circular dielectric strip 78 is also masked off. Dielectric strip 78 forms the dielectric layer for the common node capacitive element of the lumped element circulator, such as common node capacitor 36 of FIG. 1A. A circular ground strip 80 is printed at the center of substrate 70. Thus, the common node capacitive element is formed by dielectric strip 78 disposed between circular metal strip 76 and circular ground strip 80. At the terminal end of each metal strip 72, a circular mounting pad 82, also printed metal, is formed. Accordingly, these three mounting pads 82 are positioned to receive and make contact with each metal contact bump 64 of the ferrite layer 60 when the wafer assembly 48 is flip mounted to the substrate 70.

FIG. 9 also illustrates the Y configuration of each of the three capacitive elements, but also includes three common node inductive elements, formed by three additional metal inductive strips 86 printed on substrate 70. These three metal inductive strips 86 form a common node inductor, such as common node inductor 38 of FIG. 1B. As with FIG. 8, FIG. 9 includes the three primary capacitive elements, such as capacitors 32a, 32b, 32c of FIG. 1A, formed by three metal strips 72, three dielectric spaces 74, and hexagonal metal strip 77. The terminal end of each metal strip 72 also includes a circular mounting pad 82 formed from printed metal. The common node capacitive element, such as common node capacitor 36 of FIG. 1A, is formed by the capacitance produced by the combination of hexagonal metal strip 77, dielectric spaces 84, and metal inductive strips 86. The substrate 70 illustrated in FIG. 9 is also produced using photolithographic circuit fabrication techniques known in the art. Additionally, the terminal end of each inductive metal strip 86 includes a laser drilled hole 88, which is filled with metal, forming a via to ground. As described above, the addition of a common node inductor to the circuit serves to increase the bandwidth capabilities of the lumped element circulator. Accordingly, mounting pads 82 are positioned to receive and make contact with each metal contact bump 64 of the ferrite layer 60 when the wafer assembly 48 is flip mounted to the substrate 70. It should also be noted that when a wafer assembly 48 having Y configuration elements 44 (FIG. 4) formed thereon is flip mounted to either of the substrates 70 disclosed in FIGS. 8 and 9, the central metal contact bump 64 will contactingly engage either circular metal strip 80, or hexagonal metal strip 77.

Turning now to FIGS. 10 and 11, wafer assembly 48 containing the inductive elements is shown flip-mounted to the substrate 70. As can be appreciated by this illustration, the inductors formed on ferrite layer 60 are electrically connected to the mounting pads 82 formed on the substrate 70 through the metal contact bumps 64. Additionally, a small air space 90 exists between the ferrite layer 60 and the mounting substrate 70. FIG. 10 is directed to a preferred embodiment wherein the wafer assembly 48 includes only the ferrite layer 60 and the magnetic layer 68. Alternatively, FIG. 11 illustrates an alternate preferred embodiment in which the wafer assembly 48 includes a dielectric layer 66 disposed between the ferrite layer 60 and the magnetic layer 68. While quartz is the preferred material for dielectric layer 66, one skilled in the art will appreciate that dielectric layer 66 can be made of most any non-magnetic dielectric material which will allow for the required thermal expansion between materials.

As discussed earlier, a circulator functions to provide a non-reciprocal signal path which allows circuits and other electrical components to be electrically isolated from each other. With reference to FIGS. 1A through 1D, in a typical delta or Y circulator configuration, each resonating arm of the circulator associated with port one 24, port two 26 and port three 28 is balanced. In operation, an electrical signal inputted at port one 24 is outputted at port two 26. However, the same signal inputted at port one 24 is electrically isolated from port three 28. Likewise, a signal inputted at port two 26 will show up at port three 28, but not port one 24. Finally, a signal inputted at port three 28 will show up at port one 24, but not port two 26. Thus, the input signals presented at the various ports circulate to the corresponding adjacent port as output signals.

A typical application for a circulator would be a transmission circuit and a receive circuit, both coupled to a common antenna and coupled to each other via the circulator. For example, a signal received on an antenna coupled to port one 24 would show up at a receiving circuit coupled to port two 26, but would be isolated from a transmission circuit coupled to port three 28. Additionally, a signal transmitted from a transmitter circuit coupled to port three 28 would show up to the antenna coupled to port one 24 and broadcasted from the antenna. However, this transmitted signal would be electrically isolated from the receiver circuit coupled to port two 26. From this example, one skilled in the art will appreciate the wide range of applications for which a lumped element circulator can be used. One can also appreciate that the fabrication and flip mounting techniques associated with the present invention allow a lumped element circulator to be mass produced for significantly lower costs into a smaller package which can be integrated into electronic circuits at a much higher level. The techniques associated with the present invention allow the discrete lumped inductor and lumped capacitor elements to be fabricated using existing techniques such as thin film or preferably thick film processing of metal. Further, this invention allows wafer assembly 48 to be attached using flip mounting techniques including surface mounting or chip-on-board mounting techniques.

As previously disclosed, the flip mounted lumped element circulator of the present invention can be realized in either a delta or Y configuration. The reference to delta and Y configurations are meant to differentiate between the physical and electrical differences between the two realizations. Physically, the Y configuration appears in the shape of the letter Y, while the delta configuration refers to the physical resemblance to the Greek letter A. However, electrically, the difference between these two configurations is more significant. In the Y configuration 22 the electric potential across each non-reciprocal inductor 30a, 30b, 30c is the same as is across the corresponding reciprocal capacitor 32a, 32b, 32c. However, in the delta configuration 20 the electric potential across the non-reciprocal inductor 30a, 30b, 30c is not equal to the electric potential across the reciprocal capacitor 32a, 32b, 32c.

The foregoing discussion discloses and describes exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An electrical isolation device comprising:

a base substrate having a plurality of metal strips printed thereon cooperating with each other to form four electrical capacitors wherein one of said capacitors forms a common node capacitor, one end of each of said capacitors having an associated port; and an electrically responsive wafer including a ferrite layer having a top surface, a plurality of metal strips formed on said top surface and interconnected for creating three electrical inductors, a plurality of metal bump contacts connected to said electrical inductors, a dielectric layer disposed on a bottom surface of said ferrite layer, and a magnetic layer disposed on a bottom surface of said dielectric layer;

so that said plurality of metal bump contacts of said wafer are connected to said associated port of said base substrate to form a three port electrical device.

2. The device of claim 1 wherein said electrical inductors formed on said ferrite layer are interconnected in a delta configuration.

3. The device of claim 1 wherein said electrical inductors formed on said ferrite layer are interconnected in a Y configuration.

4. The device of claim 2 wherein a common node inductor is connected between said common node capacitor and ground.

5. The device of claim 3 wherein a common node inductor is connected between said common node capacitor and ground.

6. A method for producing a electrical isolation device comprising the steps of:

providing a base substrate;

printing a plurality of metal strips on said base substrate so that said strips cooperate with each other to form a plurality of electrical capacitors;

forming an associated port at one end of each of said capacitors;

providing a ferrite layer;

printing a plurality of metal strips on a top surface of said ferrite layer for forming three electrical inductors;

forming a plurality of metal contact bumps on said electrical inductors;

forming a magnetic layer on a bottom surface of said ferrite layer whereby a ferrite wafer is produced; and securing said metal contact bumps of said ferrite wafer to said associated port of said base substrate.

7. The method of claim 6 further comprising the step of disposing a dielectric layer between said ferrite layer and said magnetic layer.

8. The method of claim 6 further comprising the step of flip mounting said ferrite wafer to said base substrate.

9. The method of claim 6 wherein one of said capacitors comprises a common node capacitor.

10. The method of claim 9 wherein a common node inductor is disposed between said common node capacitor and ground.

11. The method of claim 6 wherein said dielectric layer is quartz.

* * * * *